June 17, 1958 D. A. KELLY 2,839,685

FIXED FREQUENCY OSCILLATOR

Filed May 13, 1955

INVENTOR
DUNFORD A. KELLY
BY HIS ATTORNEYS
HARRIS, KIECH, FOSTER, & HARRIS 2,839,685

FIXED FREQUENCY OSCILLATOR

Dunford A. Kelly, Los Angeles, Calif., assignor, by direct and mesne assignments, to Harvey O. Riggs and International Electronic Research Corporation, both of Burbank, Calif., as joint owners Application May 13, 1955, Serial No. 508,167

7 Claims. (Cl. 250—36)

This invention relates to electrical oscillators and, more particularly, to an oscillator which will provide a substantial power output at closely controlled frequency and amplitude with low harmonic distortion and low internal impedance.

High power output and low distortion and good frequency stability are conflicting requirements in oscillator design. The conventional manner of improving harmonic distortion and frequency stability is to reduce the power output to a minimum and supply the power requirements by use of separate amplifiers. This results in a decrease in efficiency and an increase in the complexity of the over-all setup.

It is an object of the invention to provide an oscillator having high power output and low harmonic distortion and low internal impedance; for example, an oscillator having an output of 3 watts with a total harmonic distortion of less than $\frac{1}{20}$ of 1 percent and an internal impedance of $\frac{1}{20}$ of 1% of the load impedance.

A further object of the invention is to provide such an oscillator in which line voltage changes, load changes, tube aging, tube replacement, temperature and humidity changes and mechanical shock and vibration have negligible effect on the above characteristics.

It is a further object of the invention to provide an oscillator having high frequency and amplitude stability and one in which the output frequency and amplitude may be adjusted when desirable.

Another object of the invention is to provide such an oscillator which can be operated without requiring supply voltage regulation or buffer amplification between the oscillator output and the load.

Basically, an oscillator is an amplifier in which part of the output is coupled back to the input in proper phase and sufficient amplitude so that any signal present will build up until further increase is prevented by some limiting action. A frequency determining element, such as a tuned circuit, a crystal, or a mechanical resonator, is inserted between the amplifier output and the amplifier input and controls the frequency of the oscillations by making the amount of the signal coupled to the input a maximum at a particular frequency. The limiting action or amplitude control of an oscillator is often provided by a bridge network having a non-linear impedance in one of its arms, and having an output which is an inverse function of its input, or by other known voltage limiting devices. That is, when the amplitude output of the amplifier increases, the transmission of the amplitude control device decreases, thereby reducing the signal coupled back to the input of the amplifier and reducing the amplifier output. An oscillator circuit consisting of an amplifier, an amplitude control device, and a frequency control device will operate at a particular frequency and amplitude dependent upon the characteristics of the various components thereof.

Prior oscillators of the above class have been provided in which the gain adjustment device comprises a bridge containing a non-linear element, as a lamp, which effectively regulates the circulating energy. The bridge output is coupled to a tuned circuit through a resistor of high enough resistance to avoid undue loading of the tuned circuit. Such an oscillator suffers severely from the fact that the impedance of a lamp bulb bridge is inherently low, with the consequence that the voltage output from the bridge is unduly low. After being further reduced by the voltage dividing action of the resistor and tuned circuit, very little signal voltage is supplied to the amplifier.

The foregoing condition severely limits the negative feed-back which can be introduced for stabilization. It can be readily seen that the greater the voltage from the tuned circuit, the greater the negative feed-back voltage that can be used. The amplifier requires a certain fixed net signal voltage. The positive feed-back voltage minus the negative feed-back voltage is the net signal voltage. It follows that the greater the positive feed-back voltage, the greater can be the negative feed-back voltage, and, of course, the greater the negative feed-back voltage, the greater the stabilization of the oscillator.

A more particular object of the invention is the provision of an oscillator of the class described, in which the positive feed-back voltage is very greatly increased, with negative feed-back voltage correspondingly increased, e. g., of the order of 40 to 50 decibels or higher, yielding an oscillator of vastly improved stability.

According to the preferred practice of the invention, a voltage step-up transformer is incorporated between a lamp bulb bridge network and a parallel LC tuned circuit, and is made a part of this tuned circuit. Thus, a primary transformer winding may be placed on the tuning coil, and in a typical case, a turns ratio of 1 to 1000 may be used, giving a voltage gain of 1000 to 1. In addition, the transformer furnishes a good impedance match between the low mpedance lamp bulb bridge and the high impedance tuned circuit, giving a high improvement in signal voltage across the tuned circuit. With such increase in positive feed-back voltage fed to the amplifier, the negative feed-back voltage can be, and is, commensurately increased. Very great voltage and frequency stability are thus gained.

The invention also comprises novel details of construction and novel combinations and arrangements of parts, which will more fully appear in the course of the following description. However, the drawing merely shows and the description merely describes the preferred embodiments of the present invention as applied to an oscillator, which are given by way of illustration or example only.

Figure 1:
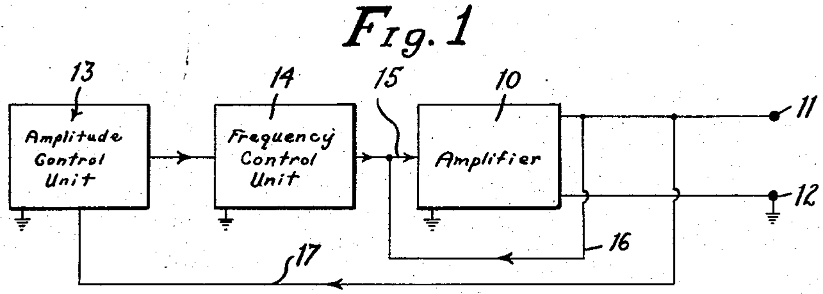
Fig. 1 is a block diagram of one embodiment of the invention.

A block diagram of an oscillator incorporating the features of the invention is shown in Fig. 1. Therein, numeral 10 is a conventional amplifier having output terminals 11, 12. An amplitude control unit 13 and a frequency control unit 14 are connected to the input 15 of the amplifier 10. It is preferred in the practice of the invention to have the output of the amplitude control unit 13 connected to the frequency control unit 14 and then to have the output of the frequency control unit connected to the input 15 of the amplifier. A degenerative feed-back path 16 couples the output of the amplifier 10 to the input 15. The output of the amplifier is also connected to the amplitude control unit 13 by a positive feed-back circuit means 17.

Figure 2:
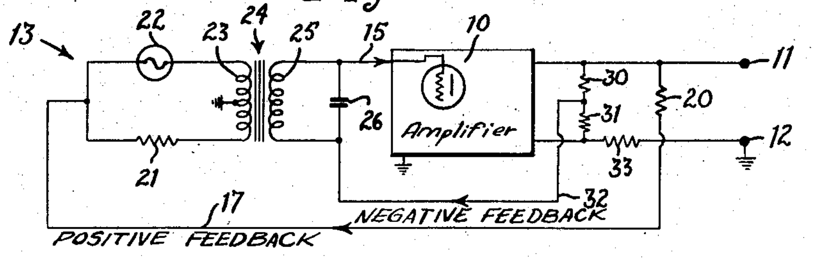
Fig. 2 is a circuit diagram of an exemplary instrumentation of the embodiment of Fig. 1.

A preferred instrumentation of the circuit of Fig. 1 is illustrated in Fig. 2. The output of the amplifier 10 is coupled back to the amplitude control unit 13 through a resistor 20 and lead 17, furnishing positive feed-back. The amplitude control unit 13 consists of a bridge circuit having a resistor 21, a nonlinear impedance element 22, such as the indicated lamp, and a tapped primary winding 23 of a step-up voltage transformer 24 as the arms thereof. The tap of the winding 23 is connected to circuit ground, as is the output terminal 12 of the amplifier. A secondary winding 25 of the transformer 24 is tuned to the desired frequency of oscillation by a shunt capacitor 26, the output of this inductance-capacitance tuned circuit being coupled to the amplifier input 15.

A voltage dividing network consisting of serially connected resistors 30, 31 is connected across the amplifier output. The junction point of the resistors 30, 31 is connected to the input 15 of the amplifier through the tuned secondary winding 25 and capacitor 26 by a connection 32. This connection provides the degenerative voltage feedback of the oscillator and the desired feedback ratio may be obtained by adjusting the relative values of the resistors 30, 31. A further reduction to substantially zero in the terminal impedance of the oscillator may be obtained by inserting a resistor 33 in one of the output leads of the amplifier, thereby producing positive current feedback.

The bridge circuit comprising the amplitude control unit 13 is typically a low impedance device, being directly coupled to the amplifier output. In order to achieve high stability and precise amplitude control, it is desirable that the operating point of the bridge be maintained very close to balance. For these two reasons, the voltage output of the bridge is very small. Because of this small output, the bridge stabilized oscillators of the prior art have not been able to utilize large amounts of degenerative feedback. The transformer 24 provides a large voltage stepup ratio between the amplitude control unit and the frequency control unit and amplifier input, thereby providing a high voltage gain between the bridge output and the amplifier input. In the embodiment of Fig. 2 a voltage gain of 1,000:1 is typical and higher gains are possible. Then the feedback ratio provided by the resistors 30, 31 may be in the order of 40 to 50 decibels.

An oscillator utilizing the features illustrated in Fig. 2 can provide 3 watts of output power with an output regulation of 1/20 of 1 percent. Higher power outputs may be obtained with similar performance figures. An oscillator having 100 watts output power can have 1/10 of 1 percent regulation.

The output of the amplitude control bridge 13 decreases as its input increases. The element 22 is nonlinear, its impedance increasing with the current in it. The bridge is operated in an unbalanced condition. If sufficient input signal where coupled to the control bridge, the bridge would be balanced and no signal would be transmitted to the amplifier input. Therefore, the balance point is never reached and the amplitude of the oscillator stabilizes at a level below this balance point. When greater sensitivity is desired, a second nonlinear element may be substituted for the resistor 21.

In the preferred embodiment of the invention the nonlinear element 22 is a heated filament lamp bulb or the like. Other nonlinear impedance elements, such as thyrite resistors, thermistors, gaseous glow lamps and rectifiers of various types may also be utilized.

Figure 3:
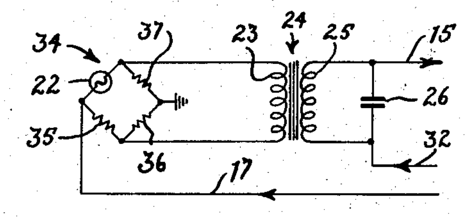
Fig. 3 shows a modification of the circiut of Fig. 2.

An alternative embodiment of the amplitude control unit 13 is shown in Fig. 3. Therein the bridge circuit 34 is separate from the primary winding 23 of the transformer 24. The bridge 34, as shown, consists of one nonlinear element 22 and three resistors 35, 36 and 37. However, when greater sensitivity is desired, one or more additional nonlinear elements may be substituted for the resistors 35, 36, 37. The ouput of the bridge is connected to the primary winding 23 and the operation of the amplitude control unit is the same as that of the embodiment of Fig. 2.

The amplifier 10 is conventional in design and may be constructed with vacuum tubes, transistors, or other similar devices. The stability of the over-all circuit is such that supply voltage regulation is not necessary in order to obtain the characteristics referred to above. An oscillator embodying the features of the invention can provide a frequency stability of plus or minus 1/40 of a cycle at 1000 cycles per second with a supply voltage variation of plus or minus 10 percent. In embodiments of the invention utilizing a vacuum tube amplifier, it has been found that the amplitude and frequency stability of the circuit is such that tubes may be changed without requiring adjustments in the circuit and even in some cases that one type of tube may be substituted for another related type, such as a 6AK5 for a 6AU6 without seriously affecting the magnitude or frequency of the oscillator output. Ordinarily, the differences in tube capacitances existing between tubes and the variations occurring with mechanical shifting of the tube structure are great enough to measurably affect the capacitance of the frequency controlling tuned circuit. However, the provision of a very large amount of degenerative feedback at the amplifier input greatly reduces the voltage coupled from the frequency control circuit to the amplifier and thereby greatly reduces the effect of capacitance charges in the vacuum tubes. In the oscillator of the invention, the capacity effect of a vacuum tube amplifier is negligible, resulting in the stable operation described.

When a vacuum tube amplifier is utilized, it is preferable to have the input 15 connected to the control grid of the input tube. This produces an improvement in performance, particularly in the form of distortion reduction, over the conventional method of coupling the degenerative feedback to the cathode and the oscillating signal to the control grid respectively of the input tube.

When low distortion is desired in an oscillator, it is conventional to operate the amplifier portion at a small fraction of its maximum signal level. Such practice results in a drastically lowered over-all efficiency for the oscillator and very low power output. A particular advantage of the oscillator of the invention is that the above given performance figures are obtained when the amplifier is being operated at its rated maximum output.

Although several exemplary embodiments of the invention have been disclosed and discussed, it will be understood that other applications of the invention are possible and that the embodiments disclosed may be subjected to various changes, modifications and substitutions without necessarily departing from the spirit of the invention.

I claim as my invention:

1. In an oscillator, the combination of: an amplifier having an input and an output; degenerative feedback means coupling said amplifier output to said amplifier input; a low impedance control bridge having an input and an output, at least one of the arms of said bridge including a nonlinear element the impedance of which varies with the current in it; positive feedback circuit means connecting said amplifier output to said bridge input; frequency control means tuned to a predetermined frequency and having an output connected to said amplifier input; and voltage step-up transformer coupling said bridge output to said frequency control means, said transformer having a low impedance input and a high impedance output.

2. In an oscillator, the combination of: an amplifier having an input and an output; degenerative feedback means coupling said amplifier output to said amplifier input; a low impedance control bridge having an input and an output, at least one of the arms of said bridge including a nonlinear element the impedance of which varies with the current in it; positive feedback circuit means connecting said amplifier output to said bridge input; frequency control means tuned to a predetermined frequency and having an output connected to said amplifier input; and voltage step-up transformer having a low impedance primary connected to said bridge output and a high impedance secondary connected to said amplifier input, said high impedance secondary being tuned to a predetermined frequency.

3. In an oscillator, the combination of: an amplifier having a high impedance input side and a lower impedance output side, a low impedance voltage amplitude limiting device comprising a network including at least two bridge arms having a common junction, a non-linear impedance element whose impedance varies with current flow therethrough included in at least one of said bridge arms, means for deriving a positive feedback voltage from the output side of said amplifier and impressing it on said bridge arms; a voltage step-up transformer having a primary winding connected to said bridge arms, a parallel resonance tuned circuit comprising the secondary winding of said transformer and a capacitor in parallel, said tuned circuit being coupled to the input side of said amplifier, and degenerative feedback circuit means coupling the output side of said amplifier to the input side of said amplifier.

4. In an oscillator, the combination of: an amplifier having a high impedance input side and a lower impedance output side, a low impedance voltage amplitude limiting device and a voltage step-up transformer, said limiting device comprising a pair of bridge arms having a common junction forming an input terminal, a non-linear impedance element whose impedance varies with current flow therethrough in at least one of said bridge arms, and a second pair of bridge arms comprised of a primary winding of said step-up transformer having a center tap providing a second input terminal, means for deriving a positive feedback voltage from the output side of said amplifier and impressing it across said input terminals, a parallel resonance tuned circuit comprising the secondary winding of said transformer and a capacitor in parallel, said tuned circuit being coupled to the input side of said amplifier, and degenerative feedback circuit means coupling the output side of said amplifier to the input side of said amplifier.

5. In an oscillator, the combination of: an amplifier having a high impedance input side and a lower impedance output side, a low impedance voltage amplitude limiting device comprising a bridge network including a first pair of bridge arms having a common junction forming an input terminal and having at the opposite ends thereof a pair of output terminals, and a second pair of bridge arms connected between said output terminals and a common junction forming a second input terminal, a non-linear impedance element whose impedance varies with current flow therethrough in at least one of said bridge arms, means for deriving a positive feedback voltage from the output side of said amplifier and impressing it across said bridge input terminals, a voltage step-up transformer having a primary winding connected across said bridge output terminals, a parallel resonance tuned circuit comprising the secondary winding of said transformer and a capacitor in parallel, said tuned circuit being coupled to the input side of said amplifier, and degenerative feedback circuit means coupling the output side of said amplifier to the input side of said amplifier.

6. In an oscillator, the combination of: an amplifier having a high impedance input side and a lower impedance output side, said amplifier utilizing a first stage amplifying device having a control grid; degenerative feedback circuit means coupling said output side to said control grid; a low impedance voltage amplitude limiting device; means for deriving a positive feedback voltage from the output side of said amplifier and impressing it on said amplitude limiting device; and coupling means including a voltage step-up device and a tuned circuit fed by the output of said amplitude limiting device and whose output is coupled to said control grid.

7. The subject matter of claim 3, wherein said degenerative feedback means couples the output side of the amplifier to the input side thereof through said tuned circuit.

References Cited in the file of this patent

UNITED STATES PATENTS

| | | |
|---|---|---|
| 2,275,452 | Meacham | Mar. 10, 1942 |
| 2,280,293 | Kreer | Apr. 21, 1942 |
| 2,379,694 | Edson | July 3, 1945 |
| 2,611,874 | Jacobsen et al. | Sept. 23, 1952 |

FOREIGN PATENTS

| | | |
|---|---|---|
| 599,963 | Great Britain | Mar. 24, 1948 |